(12) United States Patent
Ishii et al.

(10) Patent No.: US 6,538,930 B2
(45) Date of Patent: Mar. 25, 2003

(54) CHARGE PUMP CIRCUIT FOR GENERATING POSITIVE AND NEGATIVE VOLTAGE WITH REVERSE CURRENT PREVENTION CIRCUIT AND A NONVOLATILE MEMORY USING THE SAME

(75) Inventors: Motoharu Ishii, Tokyo (JP); Kayoko Omoto, Tokyo (JP)

(73) Assignee: Mitsubishi Denki Kabushiki Kaisha, Chiyoda-ku (JP)

(*) Notice: Subject to any disclaimer, the term of this patent is extended or adjusted under 35 U.S.C. 154(b) by 0 days.

(21) Appl. No.: 09/972,895

(22) Filed: Oct. 10, 2001

(65) Prior Publication Data

US 2002/0089889 A1 Jul. 11, 2002

(30) Foreign Application Priority Data

Jan. 9, 2001 (JP) ........................... 2001-001771

(51) Int. Cl.[7] .................................. G11C 5/14
(52) U.S. Cl. .................. 365/189.09; 365/227; 365/226; 365/185.27; 327/536; 327/537; 327/534; 327/545; 327/546
(58) Field of Search ............... 365/189.09, 226, 365/227, 174, 175, 149, 185.27, 185.18; 327/534, 536, 537, 530, 545, 546

(56) References Cited

U.S. PATENT DOCUMENTS 4,839,786 A * 6/1989 Ohosuga ................. 363/52

FOREIGN PATENT DOCUMENTS

| JP | 7-177729 | 7/1995 | ........... H02M/3/07 |
| JP | 2000-49299 | 2/2000 | ........... H01L/27/10 |

* cited by examiner

Primary Examiner—Andrew Q. Tran
(74) Attorney, Agent, or Firm—Burns, Doane, Swecker & Mathis, LLP

(57) ABSTRACT

A charge pump circuit comprising: a first reverse current prevention circuit connected between an external power supply and a first internal node; a first output node, connected to the first internal node, for outputting a first output potential; a second reverse current prevention circuit connected between a second power supply node receiving ground potential and a second internal node; and power supply generation circuit, connected between the first internal node and second internal node, for enhancing the potential of the second internal node as compared to that of the first internal node, wherein the power supply generation circuit is formed on or within a semiconductor substrate, and includes a diode element provided so as to flow a current from the first internal node to the second internal node, and a capacitor having one electrode connected to the first and second nodes, and the other electrode provided with a clock signal, thereby enabling higher outputs on both positive and negative voltages.

10 Claims, 18 Drawing Sheets

EXTRACTION OF ELECTRONS

CHARGE PUMP CIRCUIT FOR GENERATING POSITIVE AND NEGATIVE VOLTAGE WITH REVERSE CURRENT PREVENTION CIRCUIT AND A NONVOLATILE MEMORY USING THE SAME

BACKGROUND OF THE INVENTION

1. Field of the Invention

The present invention relates to a semiconductor integrated circuit, and more particularly a charge pump circuit for generating a positive or negative voltage on the basis of a power supply potential supplied from an external source, and an operation method of a non-volatile memory using the charge pump circuit.

2. Description of the Prior Art

A power supply supplied from an external source to a semiconductor integrated circuit is typically provided with a simple power supply or two power supplies. However, an electric device such as flash memory which needs a plurality of power supplies requires to generate internally a desirable voltage. A circuit playing such a role is called "charge pump circuit". The charge pump circuit is comprised of a plurality of capacitors, drivers, and oscillators, and cannot help scaling down the dimension of the power supply voltage to perform a reduced power consumption with development of semiconductor integrated circuits in recent years. Therefor, a charge-up from a low voltage is requisite, which directs to increase the stage number of capacitors and drivers. As the miniaturization of a memory array section advances, it is difficult to miniaturize a power supply unit such as charge pump in the actual state.

FIG. 16 is a circuit diagram showing a conventional charge pump circuit for positive voltage generation, for example, as described in JP-A2000-49299. This is a circuit which generates a positive voltage higher than an external power supply. In the drawing, reference numerals 41 and 42 each designate an inverter, which constitutes a driver 104; 51–53 each designate a diode; 61–63 each designate a capacitor; 71 designates a capacitive load provided by an internal circuit, wire resistance, and so on; 101 designates an external power supply which feeds Vdd potential; 102 designates a ground which feeds GND potential; 105 designates an oscillator; 108 designates an NMOS transistor (N-channel MOS transistor); and N1–N4, N11, and N12 each denote a node.

Here, the external power supply 101 is a power supply to be applied so that a user can utilize a semiconductor integrated circuit. In addition, the diodes 51–53, capacitors 61–63, and drivers 104 are components which are necessary for the charge pump circuit for positive voltage generation; and the oscillator 105 is a circuit which generates a pulse-form input signal necessary to operate the charge pump circuit for positive voltage generation.

The input signal generated from the oscillator 105 is input to the inverter 41 constituting the driver 104 as a clock signal Φ to be inverted, thereby resulting in a clock signal /Φ. This branches at the node N11 into two signals in which the one signal affects the capacitor 62 and the other signal is input to the next inverter 42 to be inverted, resulting in the reverted clock signal Φ. This affects the capacitors 61 and 63 via the node N12.

In addition, the NMOS transistor 108 which connects to the external power supply 101 charges the capacitors 61–63 and capacitive load, and serves as a transistor which prevents the electric charge boosted to a positive voltage from flowing into the ground 102. The capacitive load 71 is comprised of decoders, wells, and the like of a non-volatile memory array, and is a capacitance to be charged by the charge pump circuit. Note that NVth represents a threshold voltage value of the NMOS transistor 108, while Vth represents a threshold voltage value of each of the diodes 51–53.

The operation will be next described below.

The initial status of the charge pump circuit for positive voltage generation is denoted in FIG. 17. Here, H level (Enable Signal or ES) to the gate of the NMOS transistor 108 is input to be active state, i.e. ON state, and an electric charge of Vdd−(NVth+3Vth) is charged in the capacitive load 71. As shown in FIG. 18, in the charge-up status, an input signal (INPUT) generated from the oscillator 105 with respect to the aforementioned initial status is input to the driver 104, the complimentary clock signals Φ and /Φ which are generated via the inverters 41 and 42 constituting the driver 104 are applied alternately to the capacitors 61–63, which are pumped up based on the characteristics of the diodes. In such a way, the output POUT may be booted up to 3Vdd−(NVth+3Vth) at the maximum.

On the other hand, FIG. 19 is a circuit diagram showing a conventional charge pump circuit for negative voltage generation, which generates a negative voltage of a larger dimension than that of the external power supply 101. In the drawing, reference numeral 113 designates a PMOS transistor (P-channel MOS transistor); the other components are similar to those of FIG. 18, and these redundant description will be omitted. The PMOS transistor 113 fills an electric charge to the capacitors 61–63 and capacitive load 71, while it serves as a transistor in which an electric charge leveled down to a certain negative voltage prevents from flowing into the ground 102 of an external power supply. Note that PVth denotes a threshold voltage value of the PMOS transistor 113.

In this case, a difference between the charge pump circuits for positive voltage generation and for negative voltage generation is simply in that the polarity of the electric charges to be charged in the capacities 61–63 and 71 is contrary; the operation detail from the initial status to the charge-up status is the same, and the description will be omitted. In the charge pump circuit for negative voltage generation, the output NOUT may be leveled down upto a voltage of −3Vdd+(PVth+3Vth) at the maximum.

Then, FIGS. 20 and 21 are circuit diagrams showing a conventional charge pump circuit, for example, disclosed in JP-A 07/177729; FIG. 20 represents a positive voltage output status, while FIG. 21 represents a negative voltage output status. A problem will be described below when both positive and negative voltages are generated by a simple charge pump circuit. In the drawings, reference numeral 64 designates a capacitor; 109 designates a PMOS transistor; and the other components are similar to those of the circuits of FIGS. 18 and 19 above.

A difference between such a charge pump circuit and the above-described charge pump circuit which can generate only either of positive and negative voltages is as follows: The ground 102 is connected to the node N4 by way of the PMOS transistor 109, and the capacitor 64 is prepared instead of the capacitive load 71, whereby the input signal generated from the oscillator 105 via the driver 104 is provided as clock signals Φ and /Φ.

The operation will be next described below.

Referring to FIG. 20, for the purpose of generating a positive voltage, when H level is input to the gate of the NMOS transistor 108 and H level is input to the gate of the PMOS transistor 109, the NMOS transistor 108 is ON state, while the PMOS transistor 109 is OFF state. Thus, since the charge pump circuit is equivalent to that shown in FIG. 16, when the complimentary clock signals Φ and /Φ (Vdd potential) are input to the capacitors 61–64 via the inverters 41 and 42 constituting the driver 104, the potentials of the nodes N1–N4 are leveled up and down in synchronization with the clock signals Φ and /Φ in pulse form, and the capacitors 61–64 are pumped up, coupled with the characteristics of the diodes 51–53, thereby providing a positive voltage output POUT.

On the other hand, referring to FIG. 21, for the purpose of generating a negative voltage, when L level is input to the gate of the NMOS transistor 108 and L level is input to the gate of the PMOS transistor 109, the NMOS transistor 108 is OFF state, while the PMOS transistor 109 is ON state. In such a way, since the charge pump circuit is equivalent to that of FIG. 19, similarly, the capacitors 61–64 are pumped up, thereby providing a negative voltage output NOUT.

Since the conventional charge pump circuit is configured as described above, there are the following problems.

On generating the positive voltage of FIG. 20, as described in above, the NMOS transistor 108 is set to ON state so as to charge a Vdd–Vth potential, while the PMOS transistor 109 is OFF state (Vdd potential) so as not to discharge an electric charge toward the ground 102. However, the positive voltage output POUT is set to Vdd potential or more, resulting in discharging from the PMOS transistor 109 to the ground 102 and therefor has no boosted potential, thereby obtaining no desired positive high voltage output.

In addition, on generating a negative voltage of FIG. 21, the PMOS transistor 109 is ON state so as to charge a (GND+Vth) potential, and the NMOS transistor 108 is put on OFF state (GND potential) so as to prevent charging from a power supply 101. The negative voltage output NOUT, however, is brought to GND potential or less, so that Vdd potential may be charged from the power supply 101 by way of the NMOS transistor 108, thus not falling the potential. As a result, a negative high voltage output cannot be also obtained.

As described above, there is a problem that the conventional charge pump circuit for positive and negative voltages generation can generate the two power supplies of positive and negative voltages, while a desired high voltage output cannot be obtained.

In addition, when a non-volatile memory such as flash memory is operated by use of such a charge pump circuit, it is necessary to carry out injections and extractions of electrons by applying opposite high voltages to the floating gate and the well, respectively. However, in an operation method of a non-volatile memory using a charge pump circuit capable of generating both positive and negative voltages, there is a problem that the method cannot apply simultaneously the positive and negative voltages to word lines and wells.

SUMMARY OF THE INVENTION

The present invention has been made to solve the aforementioned problems, and it is an object to obtain a charge pump circuit which enables two power generations of positive and negative voltages on a desired large dimension, and an operation method of a non-volatile memory using the same.

According to a first aspect of the present invention, there is provided a charge pump circuit comprising: a first power supply node for receiving a first power supply potential; a first reverse current prevention means connected between the first power supply node and a first internal node; a first output node, connected to the first internal node, for outputting a first output potential; a second power supply node for receiving a second power supply potential lower than the first power supply potential; a second reverse current prevention means connected between the second power supply node and a second internal node; a second output node, connected to the second internal node, for outputting a second output potential; and power supply generation means, connected between the first internal node and second internal node, for enhancing the potential of the second internal node as compared to that of the first internal node, wherein the power supply generation means is formed on or within a semiconductor substrate, and includes a diode element provided so as to flow a current from the first internal node to the second internal node, and a capacitor having one electrode connected to the first and second nodes, and the other electrode provided with a clock signal.

Here, a plurality of the diode elements may be connected in series, and further comprise a capacitor having one electrode connected to a connection node in which these diode elements are connected to each other, and the other electrode provided with a clock signal.

The first reverse current prevention means may be constructed such that a diode element and a P-channel MOS transistor is connected in series to each other from the side of the first power supply potential, and the second reverse current prevention means may also be constructed such that a diode element and an N-channel MOS transistor is connected in series to each other from the side of the second power supply potential.

A first switching circuit may also be connected between the diode element and the P-channel MOS transistor of the first reverse current prevention means and a second switching circuit may also be connected between the diode element and the P-channel MOS transistor of the second reverse current prevention means.

A first switching means may be provided between the output of said first reverse current prevention means and the first internal node, and a second switching means may be provided between said output and the connection node, and a third switching means may be provided to the other electrode of the capacitor connected to the first internal node.

The diode element may be composed of a poly-diode or well-diode.

Specifically, the well-diode includes a bottom N-well formed in the P-type semiconductor substrate, a P-well formed in said bottom N-well, and a N-well formed in said P-well, and an N-channel MOS transistor of which the source is connected to ground and the drain is connected to said bottom N-well.

According to a second aspect of the present invention, there is provided an operation method of a non-volatile memory using a charge pump circuit comprising: a first power supply node for receiving a first power supply potential; a first reverse current prevention means connected between the first power supply node and a first internal node; a first output node, connected to the first internal node, for outputting a first output potential; a second power supply node for receiving a second power supply potential lower than the first power supply potential; a second reverse current prevention means connected between the second power supply node and a second internal node; a second output node, connected to the second internal node, for outputting a second output potential; and power supply generation means, connected between the first internal node and the second internal node, for enhancing the potential of the second internal node as compared to that of the first internal node, wherein the power supply generation means is formed on or within a semiconductor substrate, and includes a diode element provided so as to flow a current from the first internal node to the second internal node, and a capacitor having one electrode connected to the first and second nodes, and the other electrode provided with a clock signal, the non-volatile memory having a control gate which is connected to a word line for implementing a storing operation and an erasing operation, and a floating gate as a storage element, on a well formed inside the substrate via a dielectric, whereby a positive voltage and a negative voltage supplied from the charge pump circuit are applied to the word line and well for a certain period of time alternately.

Here, a minimum electric charge may be supplied to the word line and the well to maintain a predetermined potential between the word line and the well.

DETAILED DESCRIPTION OF THE PREFERRED EMBODIMENTS

An embodiment of the present invention will be described below.

Embodiment 1

Figure 1:
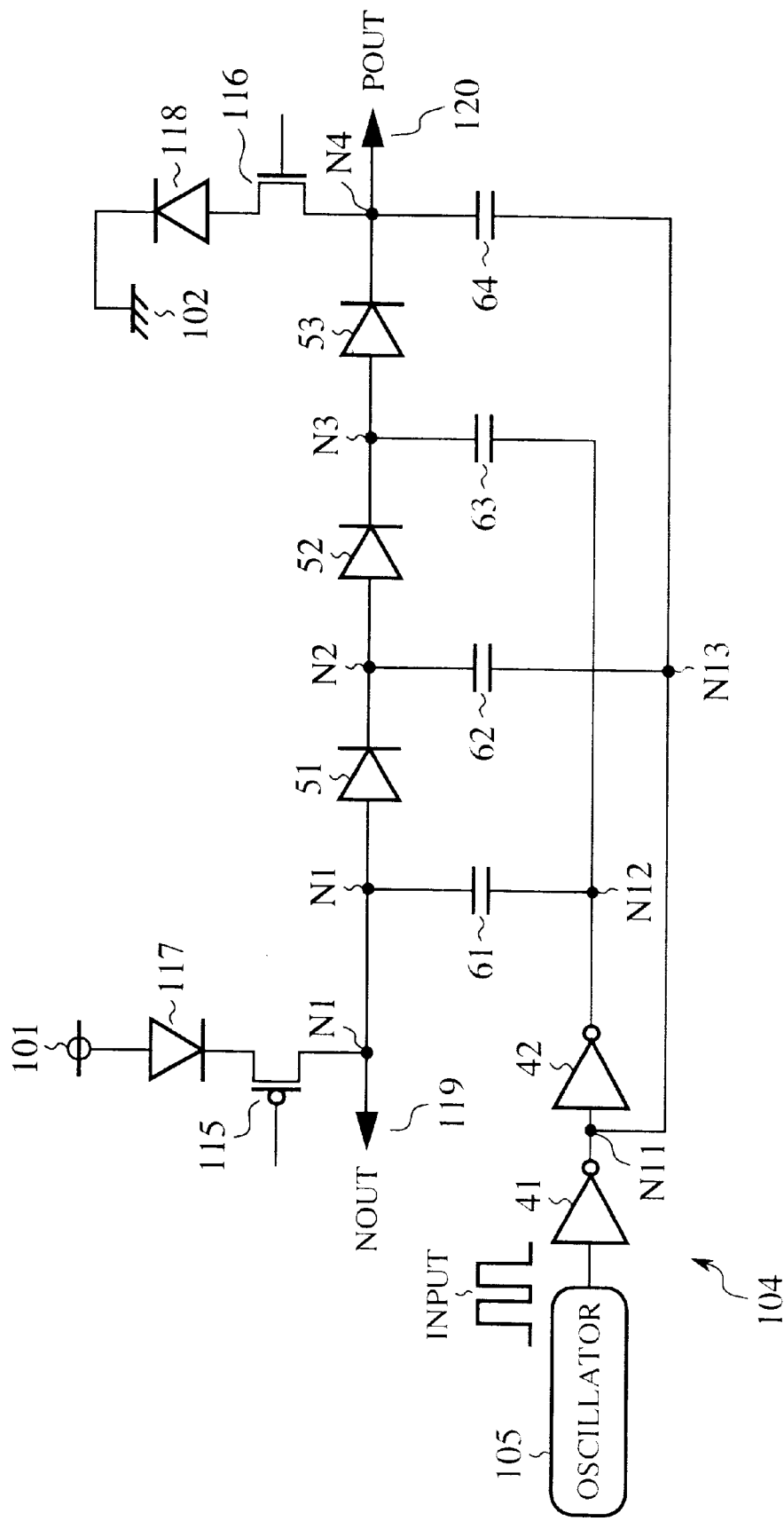
FIG. 1 is a circuit diagram showing a charge pump circuit according to an embodiment 1 of the present invention.

FIG. 1 is a circuit diagram showing a charge pump circuit according to an embodiment 1 of the present invention. In the drawing, reference numerals 41 and 42 each designates an inverter which constitutes a driver 104; 51–53, 117, and 118 each designate a diode; 61–64 each designate a capacitor; 101 designates an external power supply (first power supply potential); 102 designates a ground (second power supply potential) which feeds GND potential; 105 designates an oscillator; 115 designates a PMOS transistor (P-channel MOS transistor); 116 designates an NMOS transistor (N-channel MOS transistor); and N1–N4 and N11–N13 each designate a node. Note that the diodes 51–53 are connected in series to each other, which constitutes a voltage generation circuit (voltage generation means), and the node N1 and node N4 are connected to negative voltage output NOUT and positive voltage output POUT of the voltage generation circuit as first and second internal nodes, respectively.

Here, the external power supply 101 is a power supply so that a user can apply a semiconductor integrated circuit. In addition, the diodes 51–53, capacitors 61–64, driver 104 are components required for the charge pump circuit, and the oscillator 105 is a circuit which generates an input signal in a pulse form which is required to operate the charge pump circuit. The input signal in a pulse form generated from the oscillator 105 is input to the inverter 41 which constitutes the driver 104 as a clock signal Φ to be inverted, then resulting in a clock signal /Φ. This is branched into two signals at the node N11: the one signal works on the capacitor 62; and the other signal works is inverted to be reverted to the clock signal Φ, which works on the capacitors 61 and 63 via the node N12.

The circuitry of the embodiment 1 has the following features: The diode 117 and the PMOS transistor 115 are connected in series on the feeding side of Vdd potential to constitute a first reverse current prevention circuit, and similarly the diode 118 and the NMOS transistor 116 are connected in series on the feeding side of the ground potential GND to constitute a second reverse current prevention circuit. Incidentally, DVth denotes a threshold voltage value of the diodes 117 and 118.

The operation will be next described below.

Figure 2:
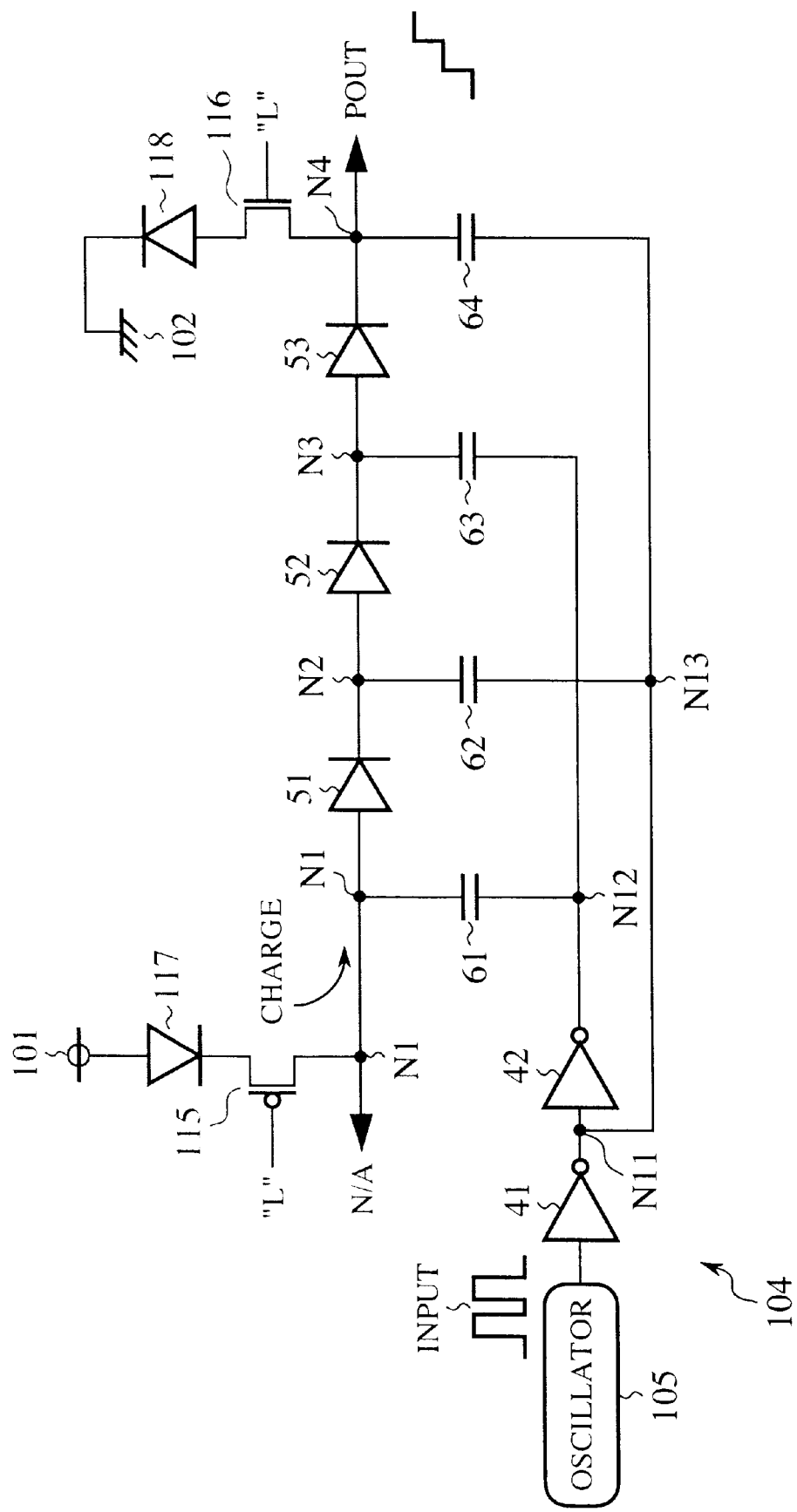
FIG. 2 is an explanatory circuit diagram illustrating a state which generates a positive voltage of the charge pump circuit according to the embodiment 1 of this invention.
Figure 16:
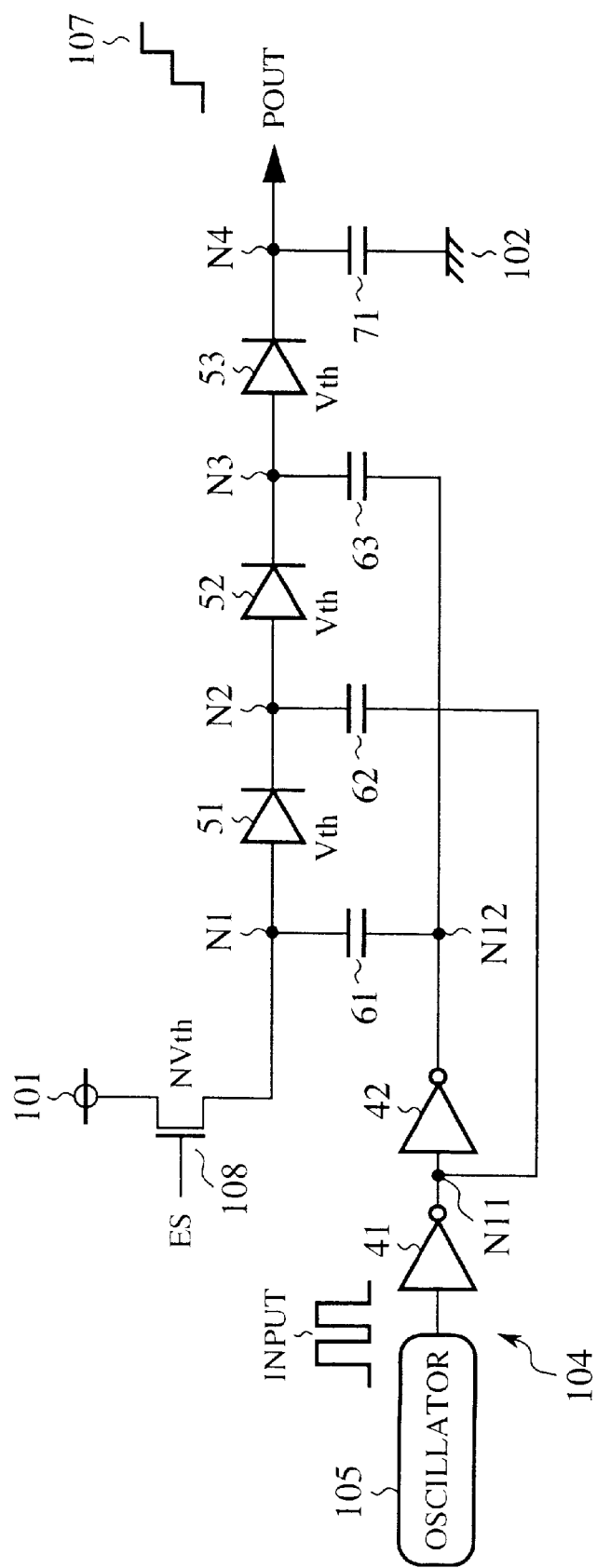
FIG. 16 is a circuit diagram showing a conventional charge pump circuit for positive voltage generation.

On generation of the positive voltage, referring to FIG. 2, L level is input to the gate of the PMOS transistor 115, and L level is input to the gate of the NMOS transistor 116. As a result, the PMOS transistor 115 is ON state, while the NMOS transistor 116 is OFF state. In such a way, the charge pump circuit is the same as that of the charge pump circuit for positive voltage generation of FIG. 16. When the complementary clock signals Φ and /Φ (Vdd level) are input to the capacitors 61–64 via the inverters 41 and 42 which constitute the driver 104, the potentials of the nodes N1–N4 are leveled up and down synchronously with the clock signals Φ and /Φ in a pulse form, and the capacitors 61–64 are pumped up, coupled with the characteristics of the diodes 51–53, so that the positive voltage output POUT may be provided via the node N4 at a desired high voltage.

For example, when the potential of the nodes N1 and N3 are enhanced, the potentials of the nodes N2 and N4 adjacent to each other tend to be down. However, the potentials of the nodes N2 and N4 are not largely down due to a current flowing in the turn of the node N1→node N2→node N3→node N4 as the diodes 51–53 work.

Conventionally, the potential of the positive voltage output POUT was not up since it was discharged to the ground where the output voltage of the positive voltage output POUT reached a certain potential not less than Vdd potential. In contrast, in the embodiment 1, the drain of the NMOS transistor 116 included in the second reverse current prevention circuit is connected to the node N4, and L level or GND potential is provided on the gate of the transistor 116 to be brought to OFF state, thereby avoiding that discharge.

Figure 3:
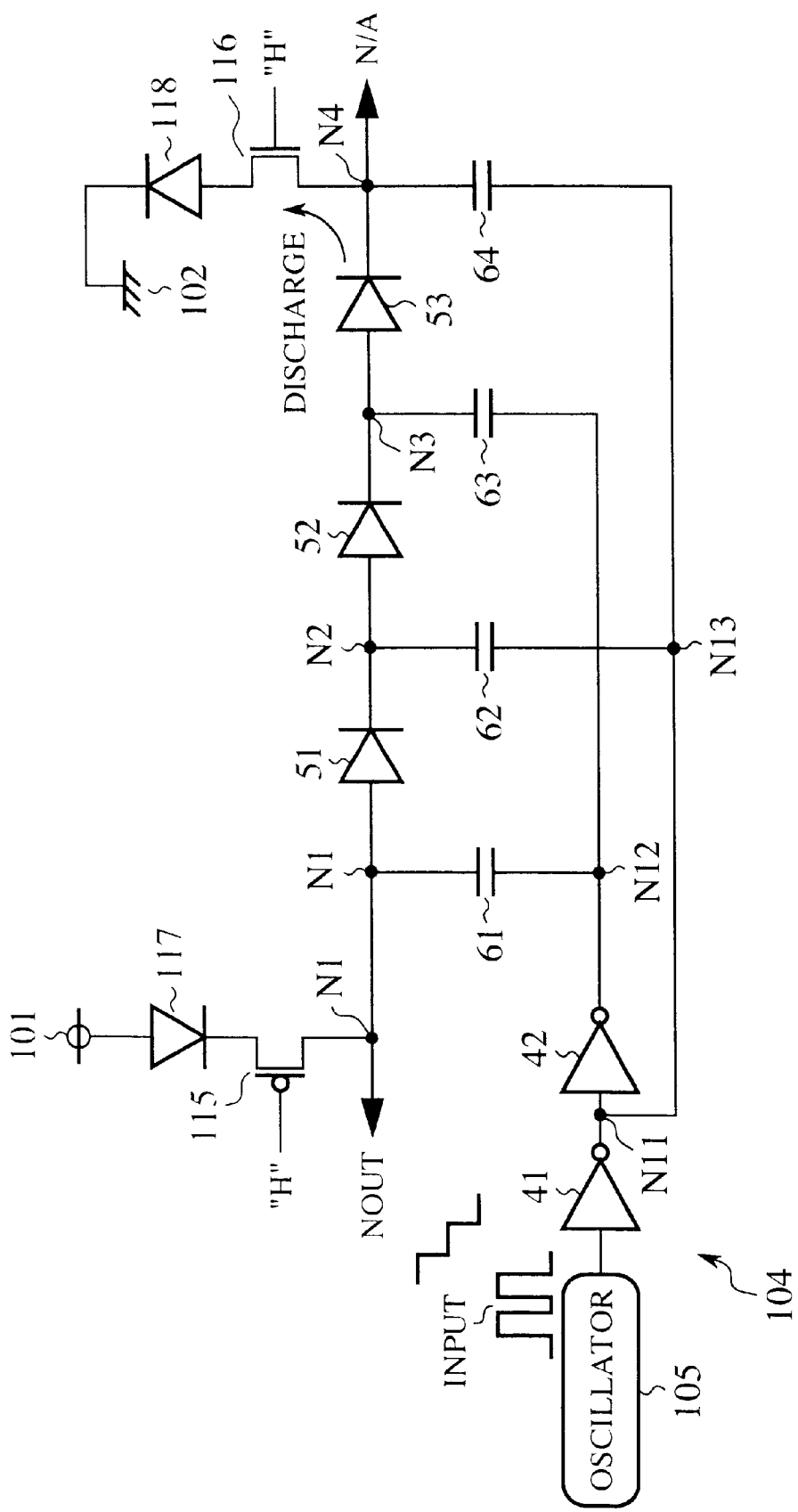
FIG. 3 is an explanatory circuit diagram illustrating a state which generates a negative voltage of the charge pump circuit according to the embodiment 1 of this invention.
Figure 17:
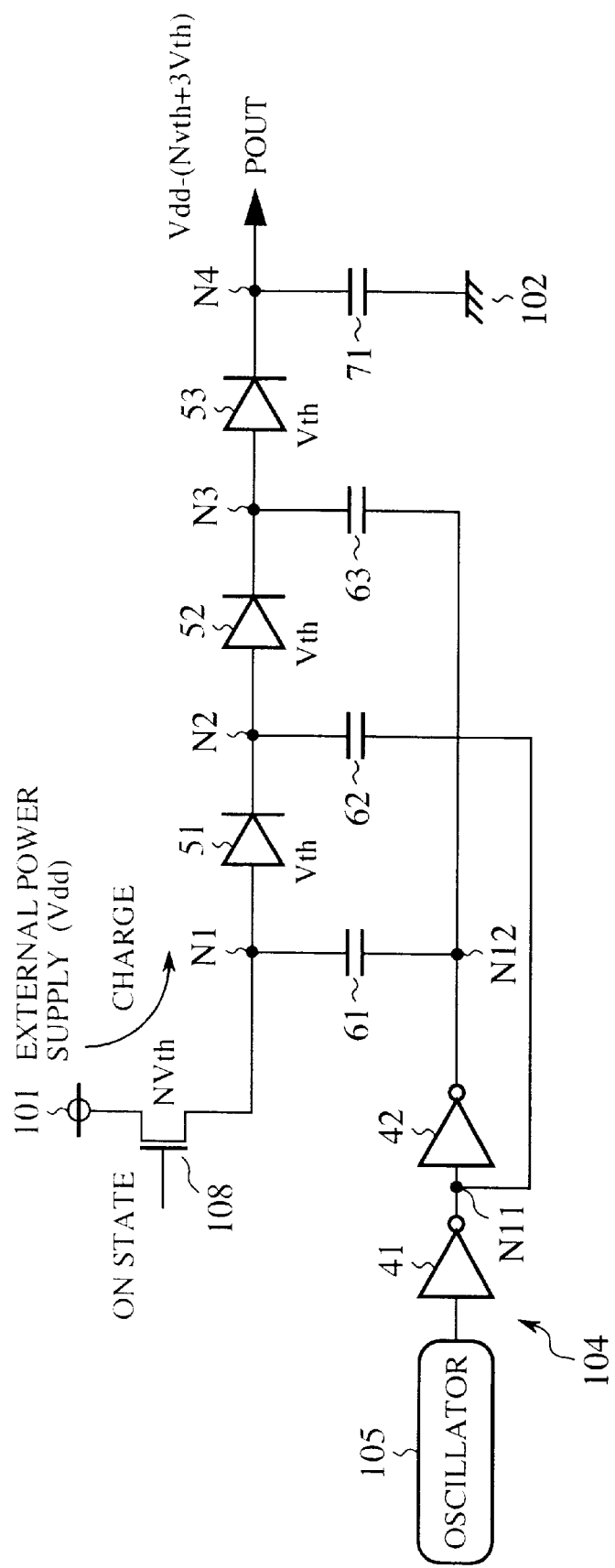
FIG. 17 is a circuit diagram to illustrate an initial status of the circuit of FIG. 16.
Figure 18:
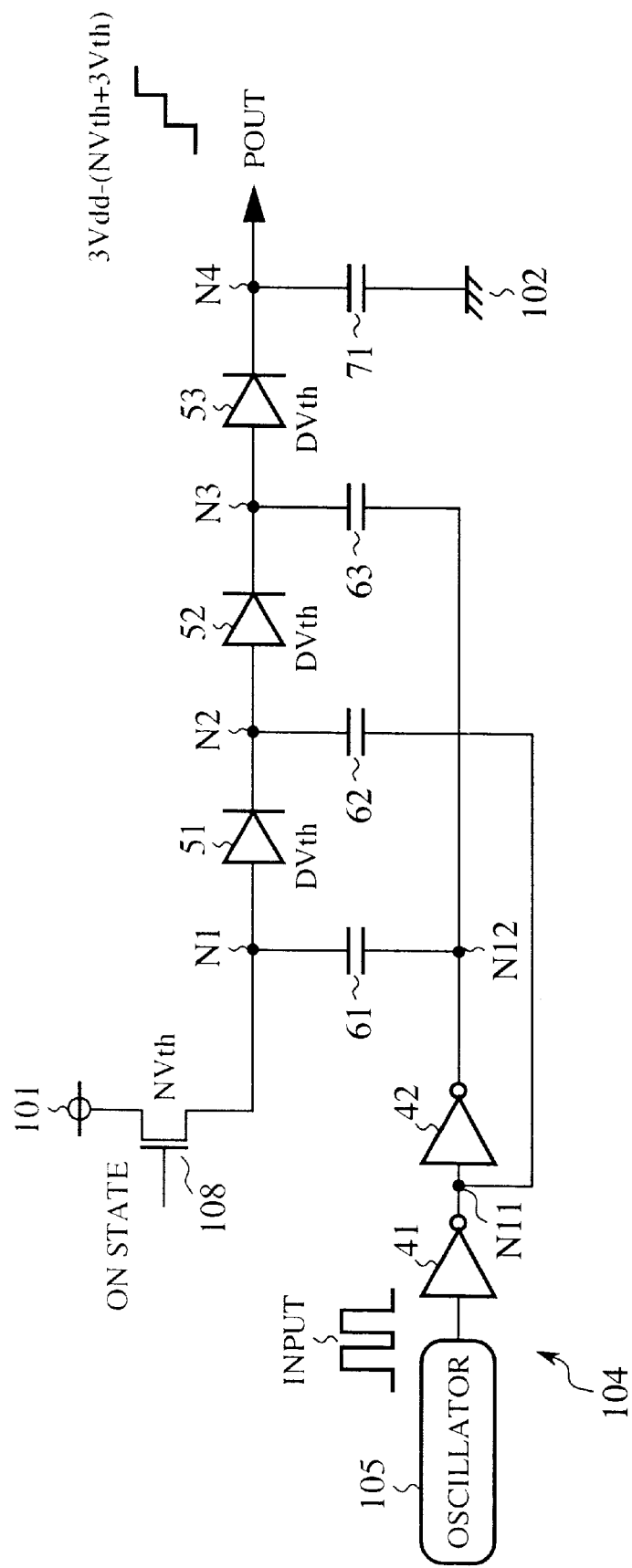
FIG. 18 is a circuit diagram to illustrate a charge up status of the circuit of FIG. 16.
Figure 19:
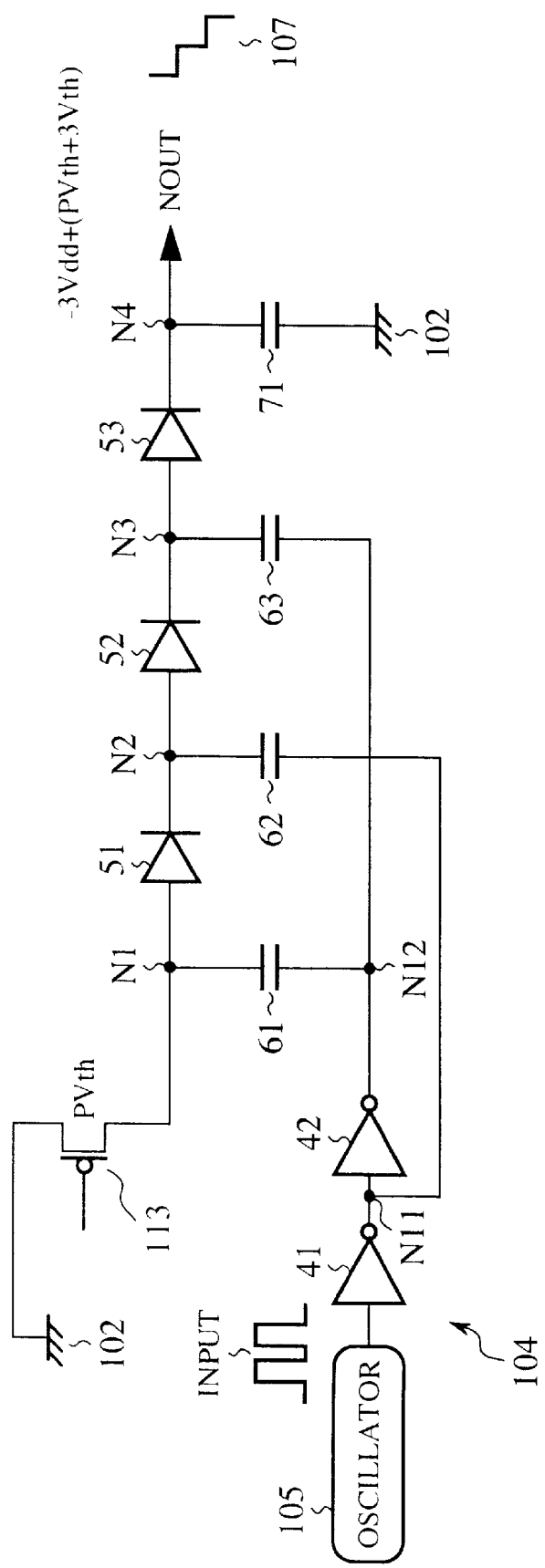
FIG. 19 is a circuit diagram showing a conventional charge pump circuit for negative voltage generation.
Figure 20:
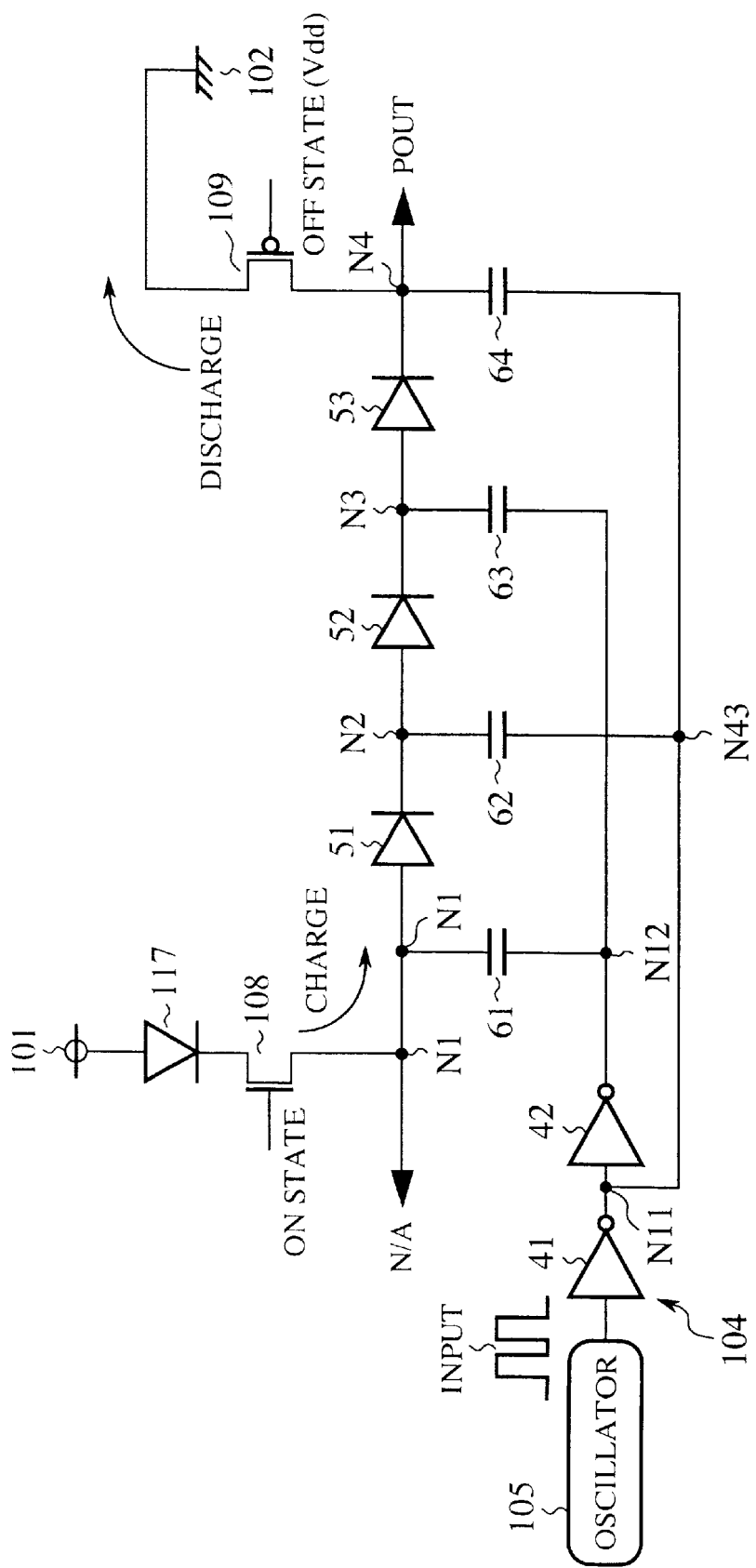
FIG. 20 is a circuit diagram to illustrate a positive voltage output status of a conventional charge pump circuit for positive and negative voltages generation.
Figure 21:
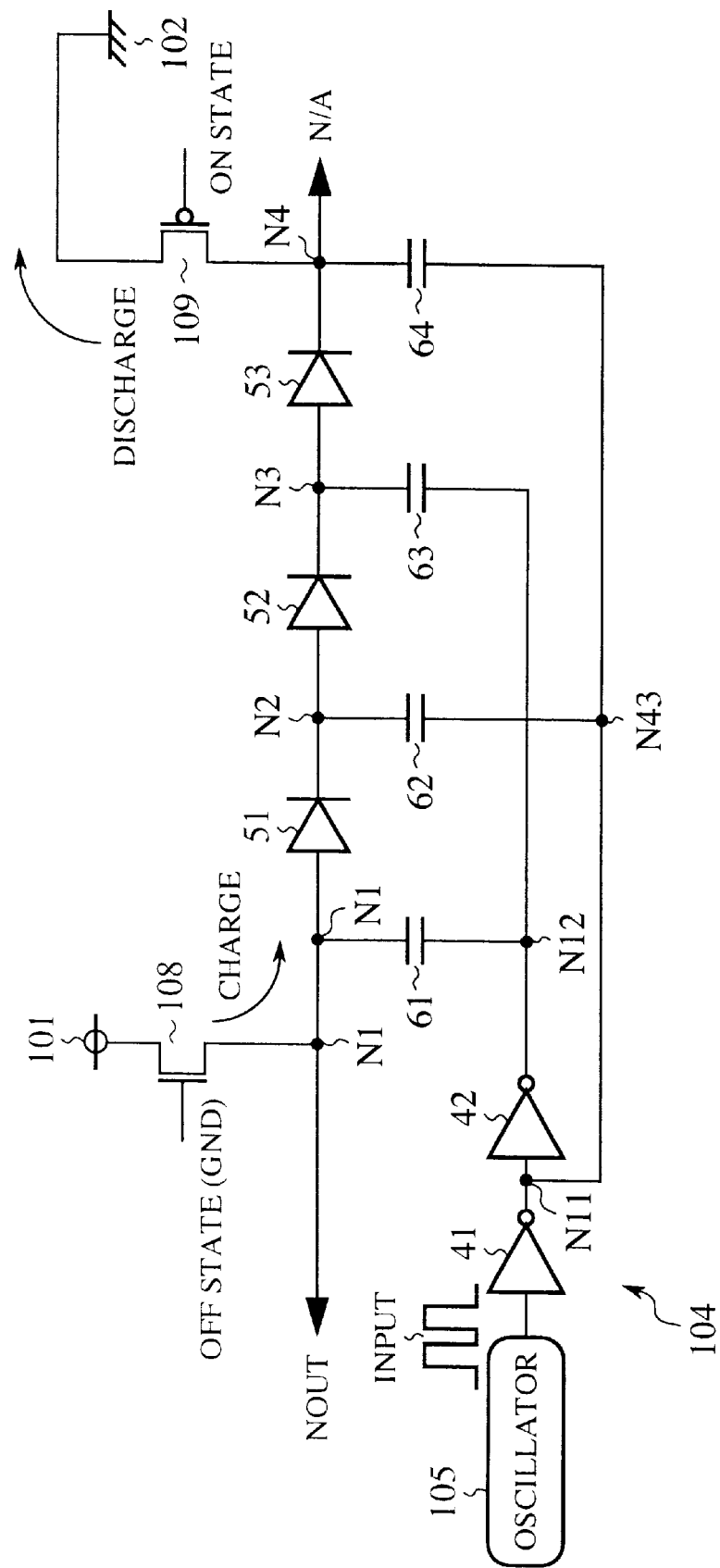
FIG. 21 is a circuit diagram to illustrate a negative voltage output status of a conventional charge pump circuit for positive and negative voltages generation.

On the other hand, on generation of the negative voltage, referring to FIG. 3, H level is input to the gate of the PMOS transistor 115, and H level is input to the gate of the NMOS transistor 116. As a result, the PMOS transistor 115 is OFF state, while the NMOS transistor 115 is ON state. In such a way, since the charge pump circuit is the same as that of the charge pump circuit for negative voltage generation of FIG. 17, the potentials of the nodes N1–N4 are up and down synchronously with the complementary clock signals Φ and /Φ, and the capacitors 61–64 are pumped up, coupled with the characteristics of the diodes 51–53, so that the negative voltage output NOUT may be provided via the node N1 at a desired high voltage.

In the prior art, the negative voltage output NOUT was not down since the output voltage of the negative voltage output NOUT reached a certain potential not less than GND potential and at the moment it was discharged to the external power supply 101. In contrast, in the embodiment 1, the drain of the PMOS transistor 115 included in the first reverse current prevention circuit is connected to the node N1, and H level or Vdd potential is provided on the gate to be brought to OFF state, thereby avoiding that discharge.

As described above, according to the embodiment 1, in a circuit construction capable of generating the two of the positive and negative voltages in a simple charge pump circuit, since the first reverse current prevention circuit is prepared on the external power supply 101 side, and the second reverse current prevention circuit is prepared on the ground 102 side, a reverse current phenomenon of discharges, which is charged from the external power supply 101 or discharged to the ground 102, may be prevented, thereby performing a desired high voltage with respect to both the directions of the positive and negative voltage outputs.

In the above, the voltage generation circuit is provided the circuit construction connected in series of the diodes 51–53. However, the high voltage outputs of the two directions, i.e. positive and negative directions, may be obtained even in a charge pump circuit which eliminates the diodes 52 and 53.

Embodiment 2

Figure 4:
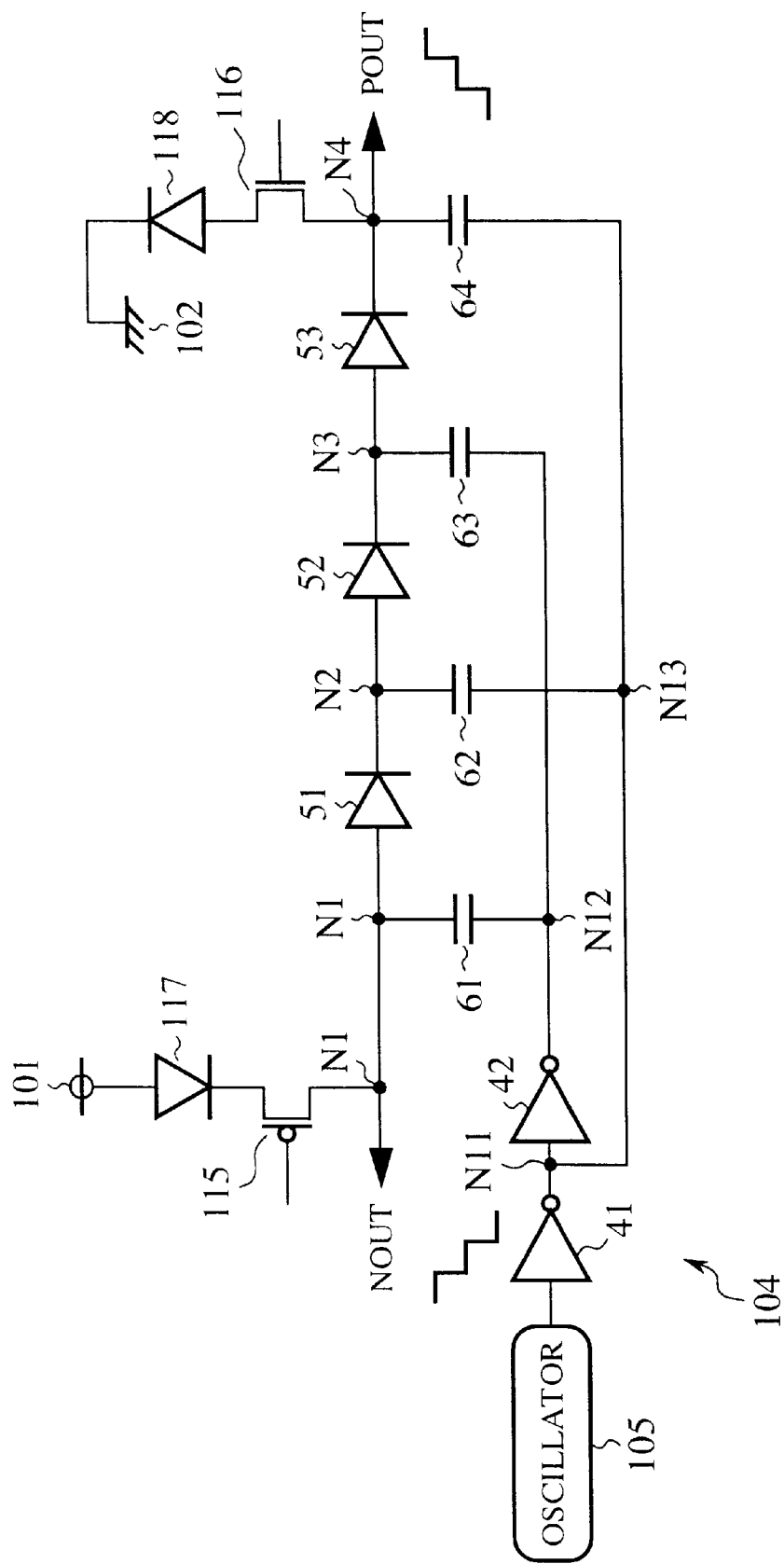
FIG. 4 is an explanatory circuit diagram illustrating a consideration in an embodiment 2.
Figure 5:
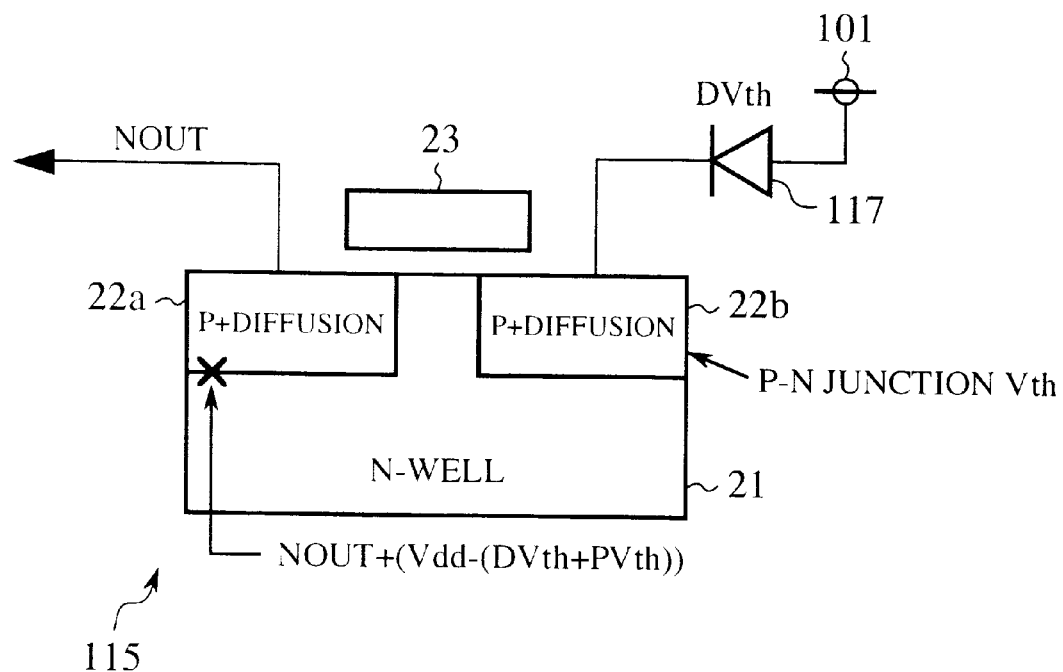
FIG. 5 is a schematic sectional view illustrating a negative voltage generation in a first reverse current prevention circuit of FIG. 4.
Figure 6:
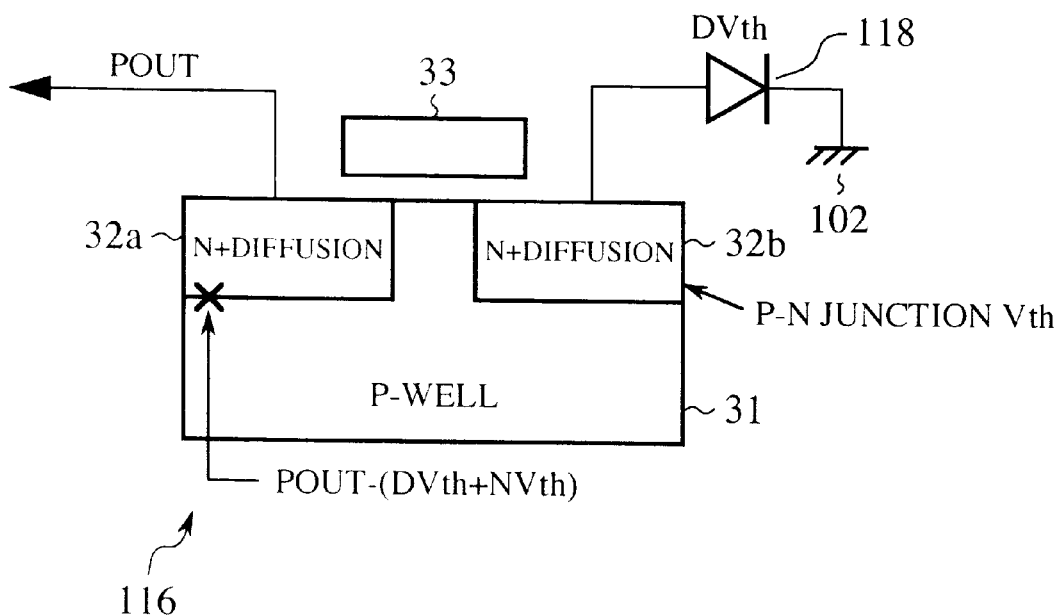
FIG. 6 is a schematic sectional view illustrating a positive voltage generation in a second reverse current prevention circuit of FIG. 4.

FIG. 4 is a circuit diagram illustrating a consideration in an embodiment 2 of the present invention, using the charge pump circuit according to the embodiment 1 shown in FIGS. 1–3. FIGS. 5 and 6 are schematic sectional views of the first reverse current prevention circuit on the external power supply 101 side and the second reverse current prevention circuit on the ground 102 side, respectively.

In the drawings, reference numeral 21 designates an N well; 31 designates a P well; 23 and 33 each designate a gate; 22a and 22b each designate a P+ diffusion layer; and 32a and 32b each designate an N+ diffusion layer. The other components are similar to those of the embodiment 1 and the redundant explanations will be omitted. For description, the threshold voltage value of the diodes 117 and 118 is denoted by DVth, and the threshold voltage value of the PN junctions between the P+ diffusion layer and the N well, and between the N+ diffusion layer and the P well is denoted by Vth.

The following point is considered in the embodiment 2: Upon operation, a high voltage may be applied to a junction between the diffusion and the well of the transistors which constitute the first and second reverse current circuits, and causes a breakdown of the junction.

That is, on generation of the negative voltage, as shown in FIG. 5, a voltage of "negative voltage output NOUT+ (Vdd−(DVth+Vth))" is applied between the P+ diffusion layer 22a connected to the negative voltage output and the N well 21. On the other hand, on generation of the positive voltage, as showon in FIG. 6, a voltage of "positive voltage output POUT+(DVth+Vth)" is applied between the N+ diffusion layer connected to the positive voltage output and the P well 31. Therefor, in a case where a high voltage is generated in any polarity of the positive and negative voltages, a leakage current may be generated over the junction breakdown voltage, which may prevent the generation of an expected voltage.

Figure 7:
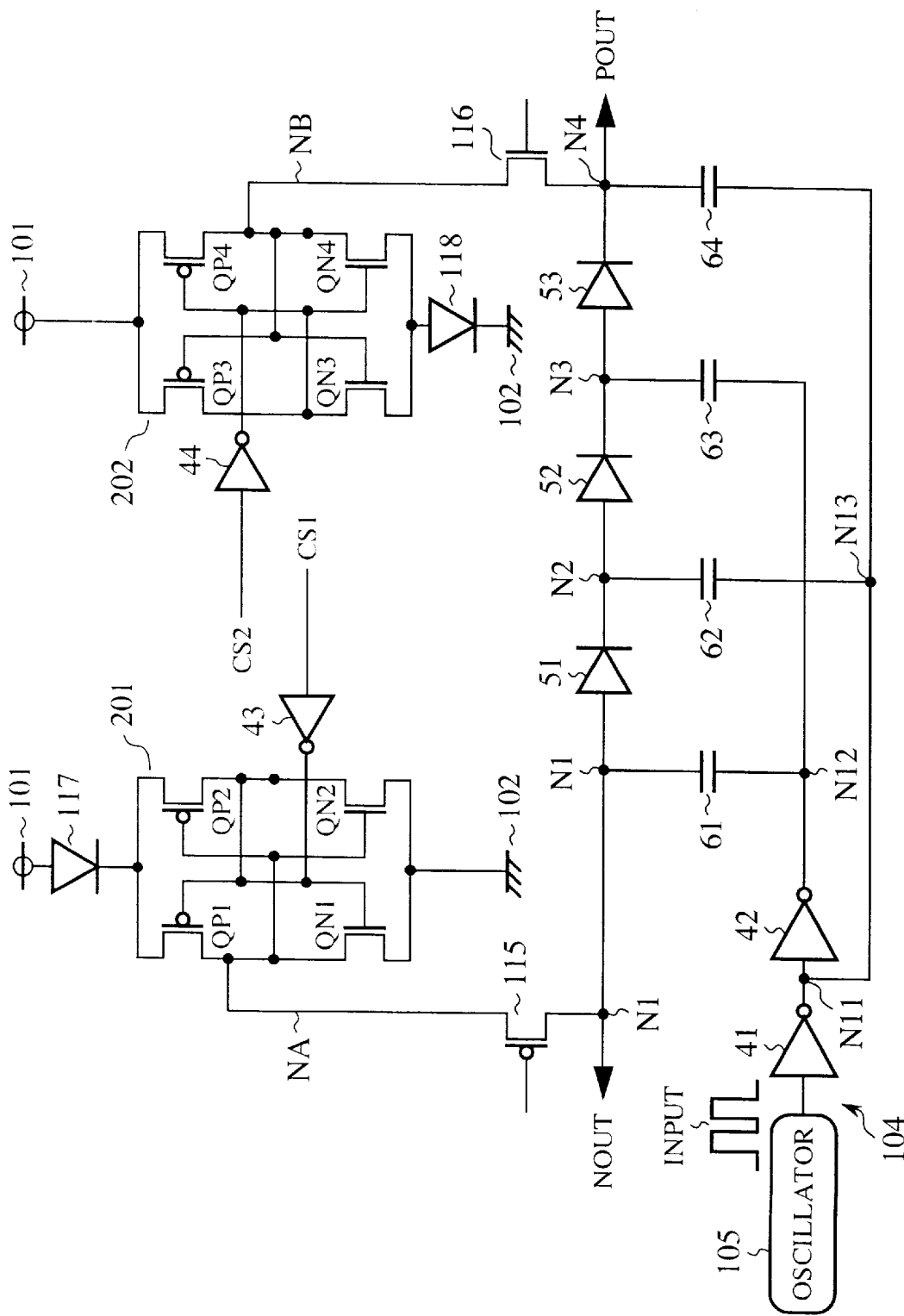
FIG. 7 is a circuit diagram showing a charge pump circuit in accordance with the embodiment 2.

In view of this point, in the embodiment 2, it is intended that first and second switching circuits are provided for the first and second reverse current prevention circuits, respectively, thereby controlling the leakage current. FIG. 7 is a circuit diagram showing a charge pump circuit according to the embodiment 2 of the present invention. In the drawing, reference numeral 43 and 44 designate inverters which are input by control signals CS1 and CS2, respectively; 201 and 202 each designate the first and second switching circuits; QP1–QP4 each denote a PMOS transistor; QN1–QN4 each denote a NMOS transistor; and NA and NB each denote a node. The other components are similar to those of the above embodiment 1, and these redundant descriptions will be omitted.

Referring to FIG. 7, the operation will be next described below.

The first reverse current prevention circuit works upon generation of the negative voltage. The source side (node NA) of the PMOS transistor 115 incorporated therein is set to GND or ground potential. In this manner, a voltage of "negative voltage output NOUT−Vth" is applied between the P+ diffusion layer 22a connected to the negative voltage output NOUT and the N well 21, thereby lowering the voltage applied to the junction section. That is, when the control signal CS1 is input to the first switching circuit 201 via the inverter 43, and H level is input to the gates of the QP1 and QN1, the QP1 is OFF and the QN1 is ON, so that GND level can be fed from the ground, thus keeping the node NA to the ground potential. In this case, since GND or L level is input to the gates of the QP2 and QN2, the QP2 is ON and the QN2 is OFF, so that Vdd potential, or H level which is the same as the control signal CS1, can be fed to the gates of the QP1 and QN1 by way of the diode 117.

On the other hand, the second reverse current prevention circuit works upon generation of the positive voltage. The source side (node NB) of the NMOS transistor 116 incorporated therein is set to Vdd potential. In this manner, a voltage of "positive voltage output POUT−(Vdd−Vth)" is applied between the N+ diffusion layer 32a connected to the positive voltage output POUT and the P well 31, thereby lowering the voltage applied to the junction section. That is, when the control signal CS2 is input to the second switching circuit 202 via the inverter 44, and L level is input to the gates of the QP4 and QN4, the QP4 is ON and the QN4 is OFF, so that Vdd potential can be fed from the external power supply 101, thus keeping the node NB to Vdd potential. In this case, since Vdd or H level is input to the gates of the QP3 and QN3, the QP3 is OFF and the QN3 is ON, so that the ground potential, or L level which is the same as the control signal CS2, can be fed to the gates of the QP4 and QN4 by way of the diode 118.

As described above, according to the embodiment 2, in the circuit construction of the charge pump circuit according to the aforementioned embodiment 1, since the first and second switching circuits are provided in the first and second reverse prevention circuits, respectively, sufficient breakdown voltages are ensured in the two directions of the positive and negative voltages, thereby generating a higher voltage in stability.

Embodiment 3

Figure 8:
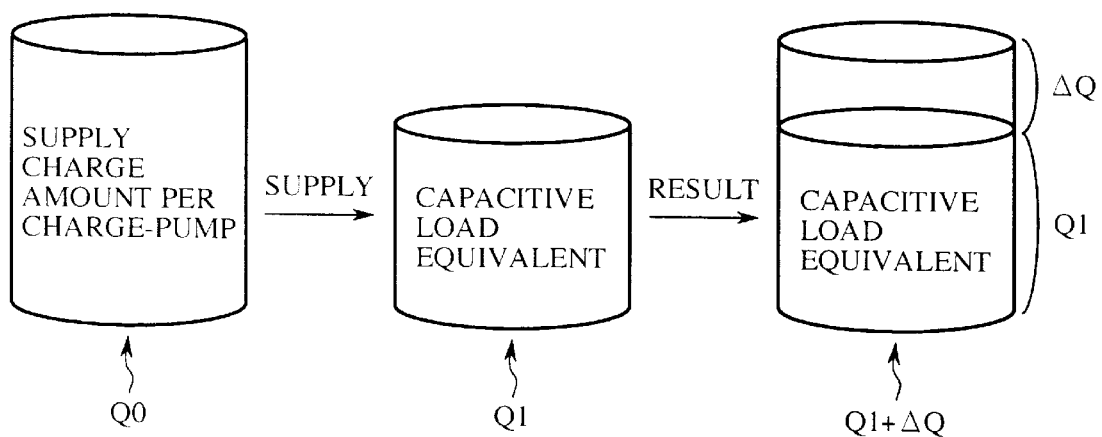
FIG. 8 is a schematic representation of a consideration in an embodiment 3.
Figure 9:
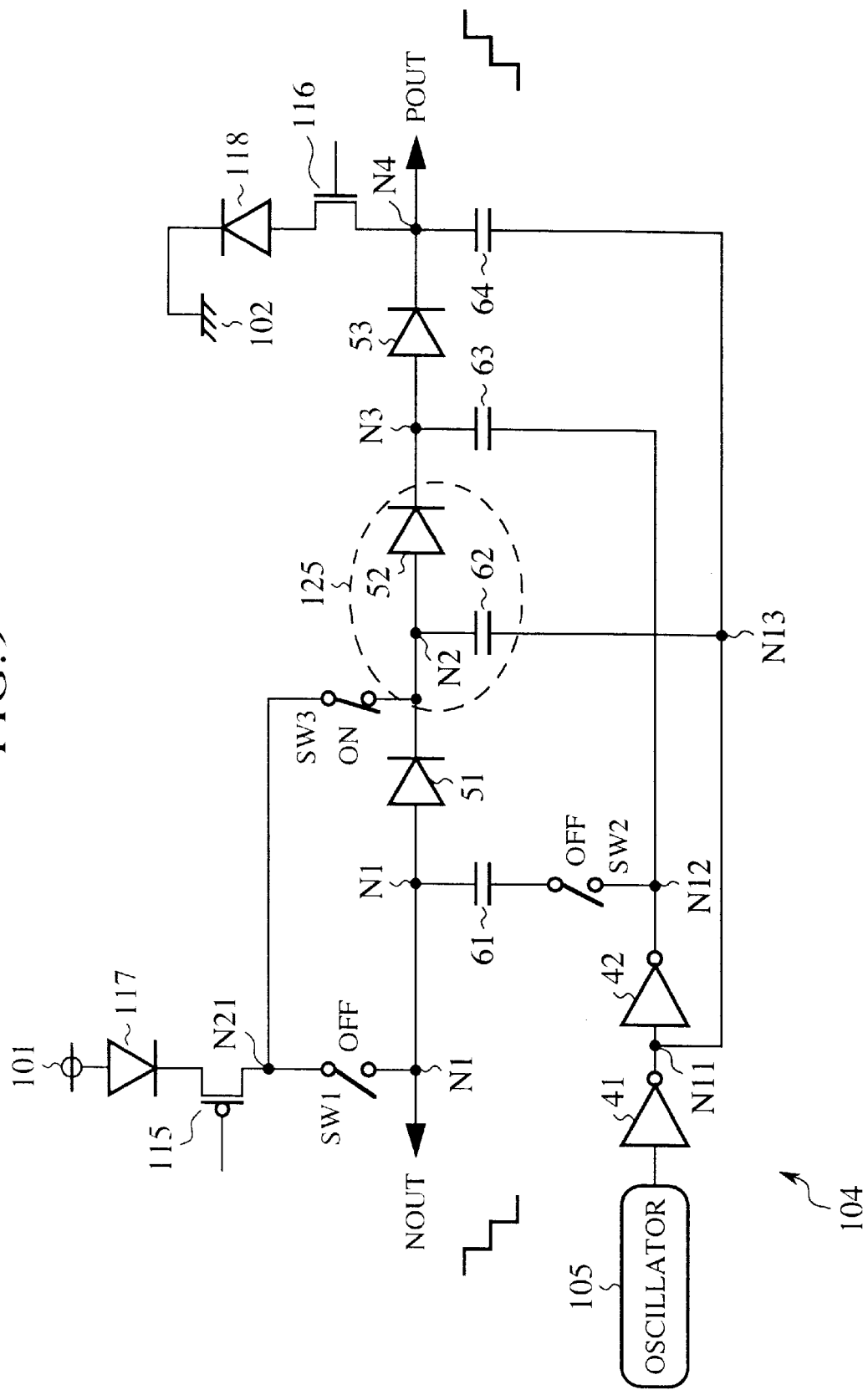
FIG. 9 is a circuit diagram showing a charge pump circuit in accordance with the embodiment 3.

FIG. 8 is a schematic illustrating a consideration in an embodiment 3 of the present invention, and FIG. 9 is a circuit diagram showing a charge pump circuit according to the embodiment 3. In the drawings, Q0 denotes the amount of supply charges per charge-pump (several pF); Q1 denotes the amount of charges (several pF) corresponding to a capacitive load; ΔQ denotes a superfluous amount of charges; SW1, SW2, and SW3 each denote a switch (first to third switching means); N21 denotes a node; and 125 denotes a minimum unit. The other components are similar to those of the above embodiment 1, and these redundant descriptions will be omitted.

Generally, the minimum unit 125 is composed of a capacitor and a diode in the charge pump circuit, and a plurality of the minimum units 125 are connected in series so as to generate a high potential. The larger the number of the connection stages, the higher the voltage to be generated, and also enlarges the supply current. However, a required voltage is sometimes different between the positive and negative voltages. There is also another case that a plurality of voltages are necessary.

Further, as a consideration, when the amount of supply charge per charge-pump is larger than that of the capacitive load because of word lines, wells, and so on, electric charges more than necessary are supplied. As a result, the potential may be enhanced over expectation.

In the embodiment 3, the stages of the charge pump circuit are set to be variable corresponding to the capacitive load. Referring to FIG. 9, this operation will be described below. FIG. 9 illustrates a three-stage charge pump circuit in which the three diodes 51–53 are connected in series. In this case, it is assumed that a desired characteristic may be obtained sufficiently by a series connection of two stages due to a small capacitive load. For example, when the switches SW1 and SW2 are turned off, and the switch SW3 are turned ON, a path which charges the capacitor 61 at the first stage (node N12 to node N1) can be separated from a path which charges up the capacitor 61 (node N21 to node N1), thereby charging an electric charge to the capacitor 62 located at the next stage by jumping the capacitor at the first stage. In such a way, an expected output characteristic may be obtained by charging up at the capacitors 62 and 63 at the next or more stages.

As described above, according to the embodiment 3, in the charge pump circuit for generation of both the positive and negative voltages, for example, on generation of a negative voltage, three stages of the diodes 51–53 connected in series are required; however on generation of the positive voltage, when only the two stages of the diodes 52 and 53 are required, by a switching operation of the switches SW1-SW3, the connection of the PMOS transistor 115 for positive charge supply is transferred to the diode 52 at the second stage via the switch SW3 turned on, and voltage boost by the driver 104 to unnecessary capacitors is stopped, thus changing the stages of the charge pump based on the capacitive load. In such a way, a power consumption may be suppressed to a minimum.

Embodiment 4

Figure 10A:
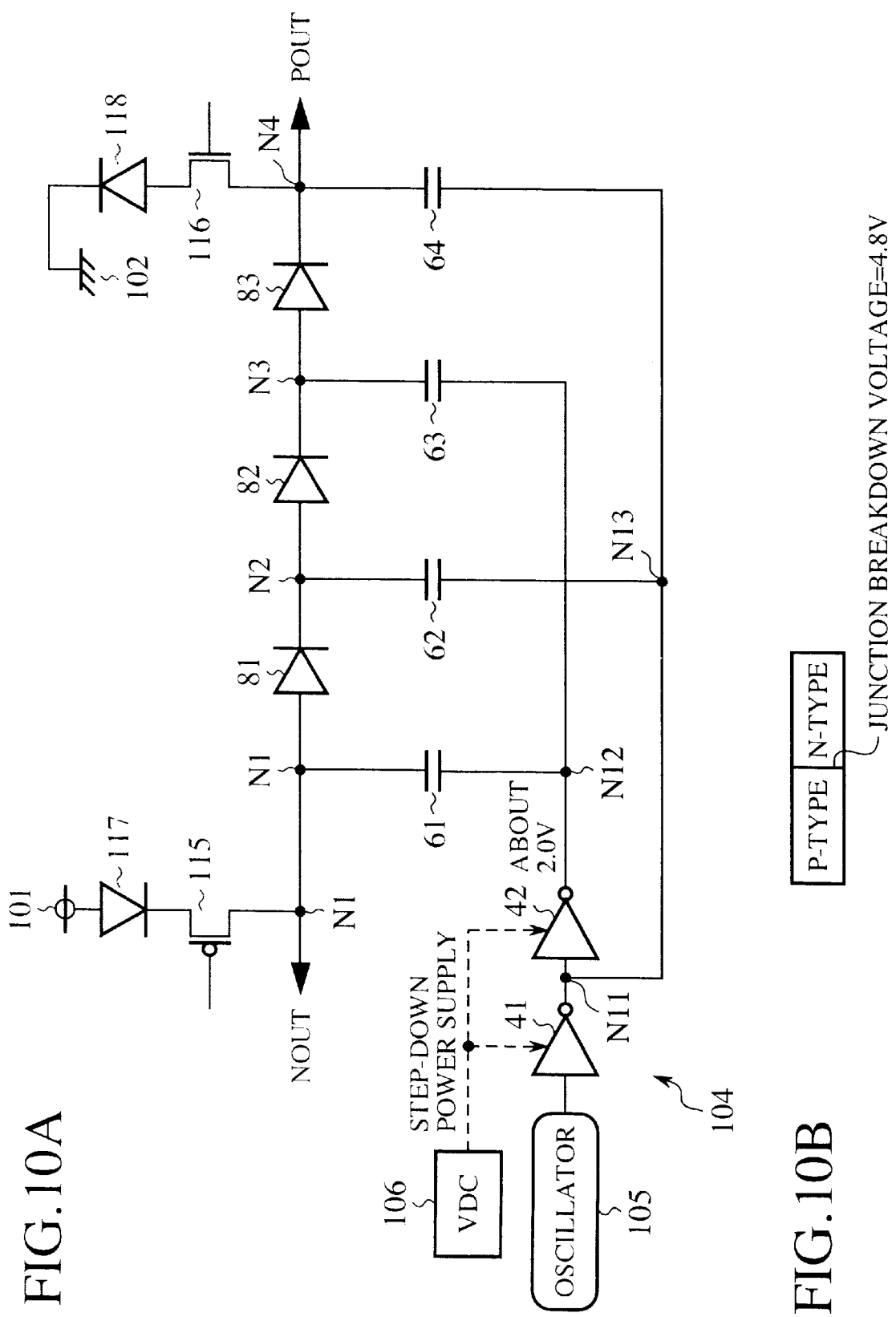
FIGS. 10A and 10B are explanatory diagrams representing a consideration in an embodiment 4.
Figure 10B:
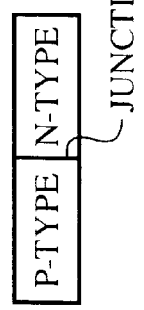

FIGS. 10A and 10B are diagrams illustrating a consideration in an embodiment 4 of the present invention: FIG. 10A shows a circuit diagram connecting a VDC to a driver when poly-diodes are employed as diode elements to be connected in series; and FIG. 10B shows a schematic sectional view of the poly-diode. In the drawings, reference numerals 81–83 each designate a poly-diode; 106 designates a VDC; and the other components are similar to those of the above embodiment 1.

When such poly-diodes 81–83 are employed, these pn junction breakdown voltage is only 4.8 V. Therefor, the VDC 106 is applied to the power supply of the driver 104 of the charge pump circuit, thus stepping down the external power supply so as to enhance the breakdown voltage. Thus, an increase of the power consumption may be worried by the addition of the VDC 106.

Figure 11:
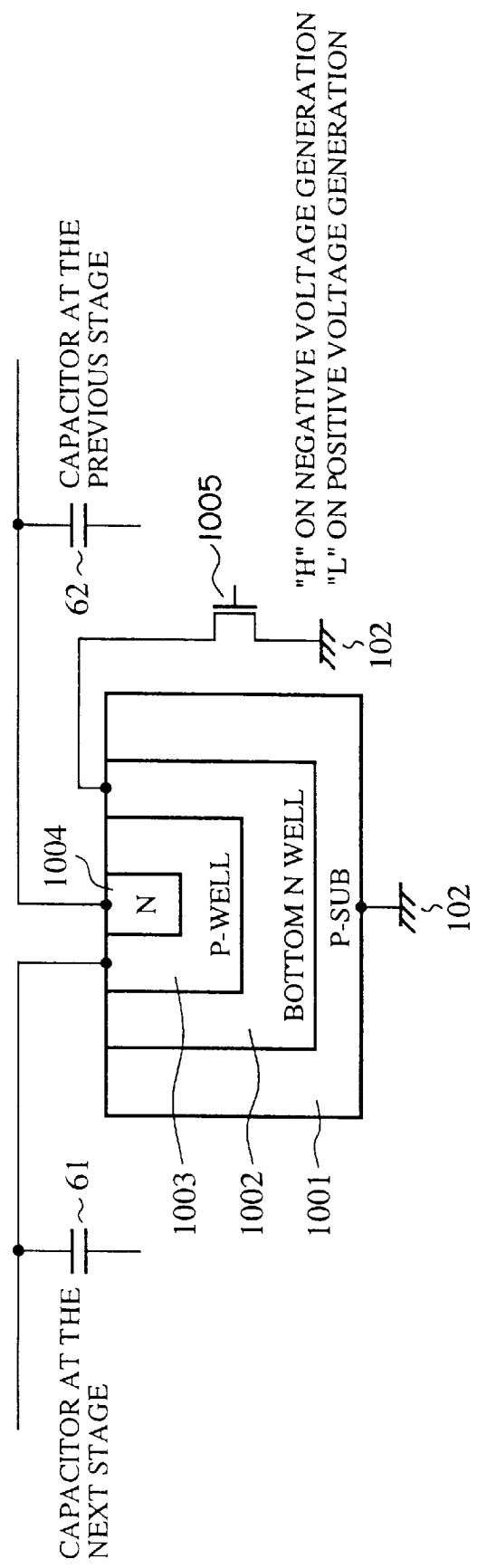
FIG. 11 is a schematic sectional view illustrating one example to be employed in the embodiment 4.

In view of this point, in the embodiment 4, instead of the poly-diodes 81–83, well-diodes each having a triple-well are employed to be similarly connected in series at three stages. FIG. 11 is a schematic sectional view showing one example of the well-diode which may be applied to the embodiment 4. In the drawing, reference numeral 1001 designates a P-type semiconductor substrate; 1002 designates a bottom N-well; 1003 designates a P-well; 1004 designates a N-well; and 1005 designates a NMOS transistor. In the circuit construction of FIG. 11, for example, the well-diode to be substituted for the position of the poly-diode 81 is prepared, the capacitor 61 is connected through the P-well 1003 as a capacitor of the next stage, and the capacitor 62 through the N-well 1004 as a capacitor of the previous stage. Note that the well-diode may be prepared to the other poly-diodes 82 and 83 in a similar manner.

The fabrication method of the well-diode is as follows.

The bottom N-well 1002 is formed in the normal P-type semiconductor substrate 1001 through ion implants of boron (B) and so on; the P-well 1003 is formed in the bottom N-well 1002 through ion implants of arsenic (As), phosphorous (P), and so on; further, the N-well 1004 is formed in the P-well 1003 through ion implants of boron (B) and the like; finally, the drain of the NMOS transistor 1005 is connected to the bottom N-well 1002, which improves to supply the ground potential from the ground 102.

The operation will be next described below.

On generation of a positive voltage, L level is applied to the gate of the NMOS transistor 1005 to open the bottom N-well 1002, while on generation of a negative voltage, H level is applied to the gate of the NMOS transistor 1005 to fix the bottom N-well 1002 at the ground potential.

As described above, according to the embodiment 4, in the charge pump circuit for positive and negative voltages generation, it is constructed that the well-diodes are substituted for the poly-diodes 81–83 connected in series, which enables to dispense with the VDC for step-down voltage supply, thereby economizing a power consumption correspondingly.

Embodiment 5

Figure 12:
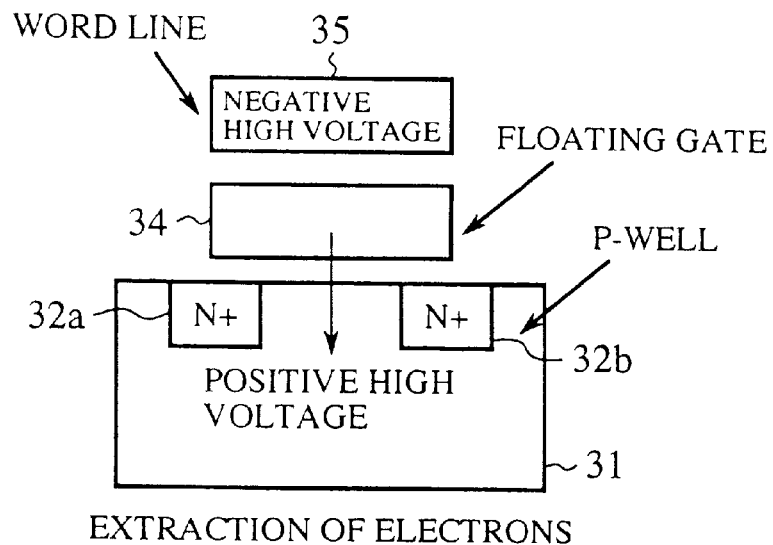
FIG. 12 is a schematic sectional view for an operation explanation in a memory cell of a typical flash memory.
Figure 13A:
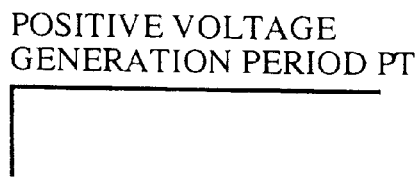
FIGS. 13A and 13B are graphs to illustrate a conventional operation method of a flash memory.
Figure 13A:
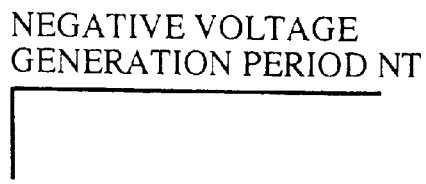
Figure 13B:
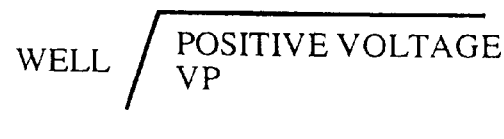
Figure 13B:

FIG. 12 is a schematic sectional view illustrating a flash memory employed in an embodiment 5, and FIG. 13 is an explanatory view of a conventional operation method of the flash memory. In the drawings, reference numeral 31 designates a P-type semiconductor substrate; 32a and 32b each designate a N+-well; 34 designates a floating gate; and 35 designates a control gate.

In operation, typically, data "1" and "0" are respectively stored in presence and absence of electrons in the floating gate 34. The above operation is carried out based on a certain effect (FN effect) which uses a Fowler-Nordheim tunneling phenomenon, i.e. contrary high voltages are applied to the well connected to the substrate 31, thereby implementing injections and extractions of electrons to the floating gate 34. For description, referring to FIG. 13, it may be considered that a negative high voltage is applied to the word line, while a positive high voltage is applied to the well, thus extracting the electrons stored in the floating gate 34 to the well. In the prior art, since a charge pump circuit for positive voltage generation and a charge pump circuit for negative voltage generation are prepared discretely, the positive voltage VP is supplied to the well for a positive voltage generation period PT and simultaneously the negative voltage VN is typically supplied to the control gate 35 for a negative voltage generation period NT.

However, in an operation method of a flash memory according to the embodiment 5 of the present invention, since both the positive and negative voltages are generated by a simple charge pump circuit, it is required that a supply timing of the positive voltage VP and negative voltage VN should be adjusted.

Figure 14A:
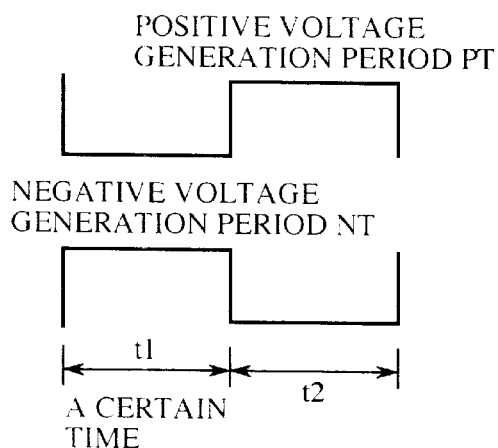
FIGS. 14A and 14B are graphs to illustrate an operation of a flash memory according to an embodiment 5 of this invention.
Figure 14B:
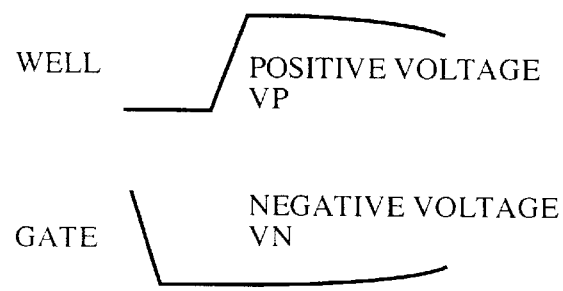

For this reason, in operation, referring to FIGS. 14A and 14B, considering off-leak, at the beginning of the pumping, for example, the negative voltage VN is supplied to the control gate 35 connected to the word line prior to a certain time t1 of a negative voltage generation period. After the passage of the time t1, the positive voltage NP is then supplied to the well for a certain time t2 of a positive voltage generation period. In this manner, the corresponding voltages are generated repeatedly to the well and control gate 35 alternatively, and an electric field is applied between the floating gate 35 and well, thereby extracting the electrons to the well.

Figure 15A:
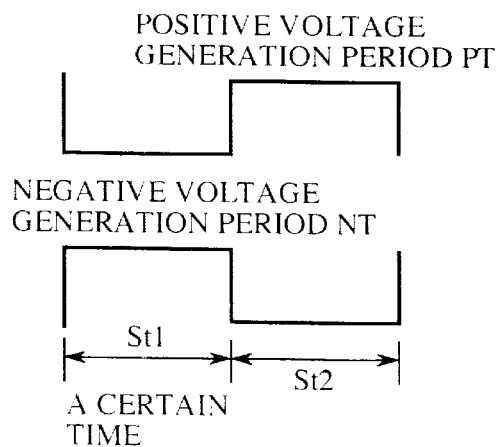
FIGS. 15A and 15B are graphs to illustrate an operation after start-up of the flash memory according to an embodiment 5 of this invention.
Figure 15B:
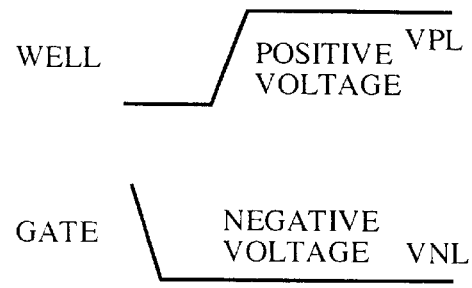

Additionally, as shown in FIGS. 15A and 15B, on start-up or activation, a simple charge pump circuit for positive and negative voltages generation described in the above embodiments 1–4 is used, and both the voltages are repeatedly generated alternatively, thus applying an electric current between the floating gate 35 and the well, while after the start-up, the electric field is maintained by minimum pumping required, thus extracting the electrons to the well, resulting in economizing a power consumption of the whole circuit.

As described above, according to the embodiment 5, in a non-volatile memory such as flash memory which carries out erase/write operations based on the FN effect, considering off-leak, while electron charges are supplied to the word line and well alternately, it is constructed that the erase/write operations may be implemented, thereby operating the non-volatile memory in a simple charge pump circuit which enables to generate both the positive and negative voltages. Therefore, the whole circuit is fabricated in a small area.

Further, after the step-up and step-down of the voltages are stabilized, the potential will be maintained by small charge pumping, thereby economizing a power consumption of the whole circuit.

What is claimed is:

1. A charge pump circuit comprising:
   a first power supply node for receiving a first power supply potential;
   a first reverse current prevention means connected between the first power supply node and a first internal node;
   a first output node, connected to said first internal node, for outputting a first output potential;
   a second power supply node for receiving a second power supply potential lower than said first power supply potential;
   a second reverse current prevention means connected between the second power supply node and a second internal node;
   a second output node, connected to said second internal node, for outputting a second output potential; and
   power supply generation means, connected between said first internal node and said second internal node, for enhancing the potential of said second internal node as compared to that of said first internal node,
   wherein said power supply generation means is formed on or within a semiconductor substrate, and includes a diode element provided so as to flow a current from said first internal node to said second internal node, and a capacitor having one electrode connected to said first and second nodes, and the other electrode provided with a clock signal.

2. The charge pump circuit according to claim 1, wherein a plurality of the diode elements are connected in series, and further comprising the capacitor having one electrode connected to a connection node in which these diode elements are connected to each other, and the other electrode provided with the clock signal.

3. The charge pump circuit according to claim 2, wherein a first switching means is provided between the output of said first reverse current prevention means and the first internal node, and a second switching means is provided between said output and the connection node, and further a third switching means is provided to the other electrode of the capacitor connected to the first internal node.

4. The charge pump circuit according to claim 1, wherein the first reverse current prevention means is constructed such that a diode element and a P-channel MOS transistor is connected in series to each other from the side of the first power supply potential, and the second reverse current prevention means is constructed such that a diode element and an N-channel MOS transistor is connected in series to each other from the side of the second power supply potential.

5. The charge pump circuit according to claim 4, wherein a first switching circuit is connected between the diode element and the P-channel MOS transistor of the first reverse current prevention means and a second switching circuit is connected between the diode element and the N-channel MOS transistor of the second reverse current prevention means.

6. The charge pump circuit according to claim 1, wherein the diode element is composed of a poly-diode.

7. The charge pump circuit according to claim 1, wherein the diode element is composed of a well-diode.

8. The charge pump circuit according to claim 7, wherein said well-diode includes a bottom N-well formed in a P-type semiconductor substrate, a P-well formed in said bottom N-well, and a N-well formed in said P-well, and an N-channel MOS transistor of which the source is connected to ground voltage and the drain is connected to said bottom N-well.

9. A non-volatile memory using a charge pump circuit comprising: a first power supply node for receiving a first power supply potential; a first reverse current prevention means connected between the first power supply node and a first internal node; a first output node, connected to said first internal node, for outputting a first output potential; a second power supply node for receiving a second power supply potential lower than said first power supply potential; a second reverse current prevention means connected between the second power supply node and a second internal node; a second output node, connected to said second internal node, for outputting a second output potential; and power supply generation means, connected between said first internal node and said second internal node, for enhancing the potential of said second internal node as compared to that of said first internal node, wherein said power supply generation means is formed on or within a semiconductor substrate, and includes a diode element provided so as to flow a current from said first internal node to said second internal node, and a capacitor having one electrode connected to said first and second nodes, and the other electrode provided with a clock signal, said non-volatile memory having a control gate which is connected to a word line for implementing a storing operation and an erasing operation, and a floating gate as a storage element, on a well formed inside said substrate via a dielectric, whereby a positive voltage and a negative voltage supplied from said charge pump circuit are applied to said word line and said well for a certain period of time alternately.

10. The non-volatile memory according to claim 9, wherein a minimum electric charge is supplied to the word line and the well to maintain a predetermined potential between the word line and the well.

* * * * *